United States Patent
Pelloie

(10) Patent No.: US 12,148,697 B2
(45) Date of Patent: Nov. 19, 2024

(54) DEVICES AND METHODS OF LOCAL INTERCONNECT STITCHES AND POWER GRIDS

(71) Applicant: Arm Limited, Cambridge (GB)

(72) Inventor: Jean-Luc Pelloie, Valbonne (FR)

(73) Assignee: Arm Limited, Cambridge (GB)

( * ) Notice: Subject to any disclaimer, the term of this patent is extended or adjusted under 35 U.S.C. 154(b) by 10 days.

(21) Appl. No.: 17/125,704

(22) Filed: Dec. 17, 2020

(65) Prior Publication Data

US 2022/0199527 A1 Jun. 23, 2022

(51) Int. Cl.
*H01L 23/528* (2006.01)
*G06F 30/3953* (2020.01)
*H01L 23/522* (2006.01)
*H01L 27/02* (2006.01)
*H01L 27/118* (2006.01)

(52) U.S. Cl.
CPC ...... *H01L 23/5286* (2013.01); *G06F 30/3953* (2020.01); *H01L 23/5226* (2013.01); *H01L 27/0207* (2013.01)

(58) Field of Classification Search
CPC ....... H01L 2027/11881; H01L 23/5226; H01L 21/76895
See application file for complete search history.

(56) References Cited

U.S. PATENT DOCUMENTS

| | | | |
|---|---|---|---|
| 11,569,246 B2* | 1/2023 | Fujiwara | H01L 27/1104 |
| 2015/0371959 A1* | 12/2015 | Frederick, Jr. | H01L 23/58 361/748 |
| 2017/0294448 A1* | 10/2017 | Debacker | H01L 27/11807 |
| 2019/0333853 A1* | 10/2019 | Kim | H01L 23/50 |
| 2020/0042668 A1* | 2/2020 | Peng | H01L 23/535 |
| 2020/0105670 A1* | 4/2020 | Zhu | H01L 27/0924 |
| 2020/0134128 A1* | 4/2020 | Peng | H01L 23/535 |
| 2021/0296235 A1* | 9/2021 | Hsu | H01L 23/5286 |
| 2021/0408011 A1* | 12/2021 | Fujiwara | H01L 23/535 |

* cited by examiner

*Primary Examiner* — Anthony Ho
*Assistant Examiner* — David J Goodwin
(74) *Attorney, Agent, or Firm* — Pramudji Law Group PLLC; Ari Pramudji

(57) ABSTRACT

According to one implementation of the present disclosure, a power grid comprising: one or more cells; a metal layer; first and second buried power rails; and one or more local interconnects, wherein one or more local interconnect stitches are configured to electrically couple the one or more cells to either of the first or second buried power rails through the metal layer and the one or more local interconnects.

17 Claims, 10 Drawing Sheets

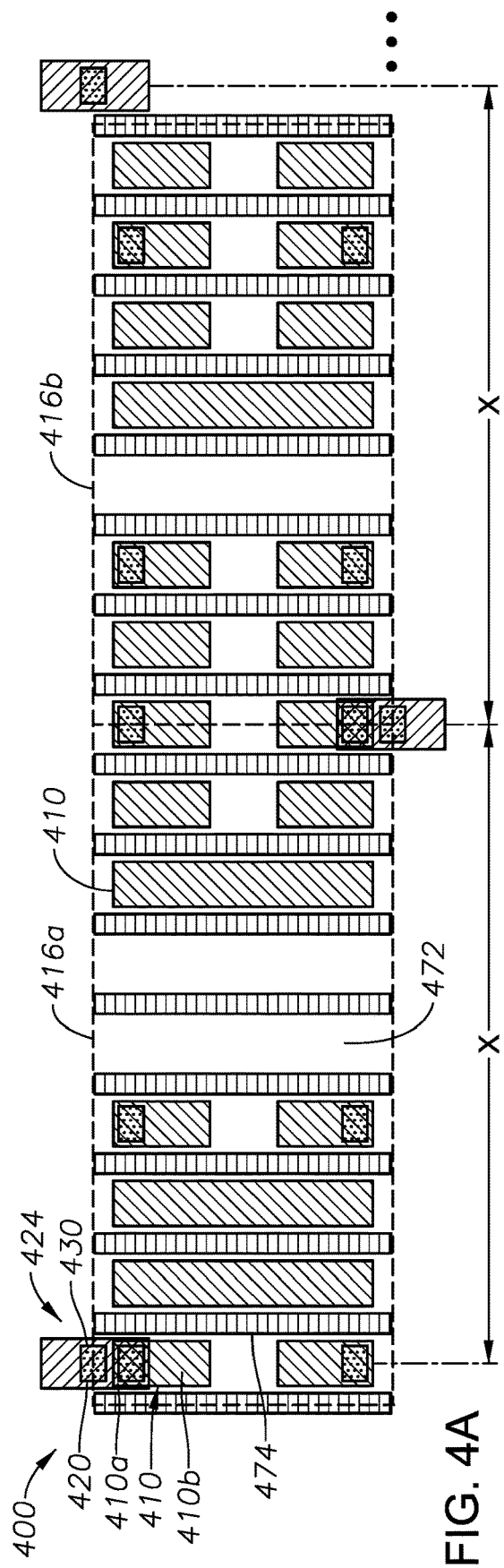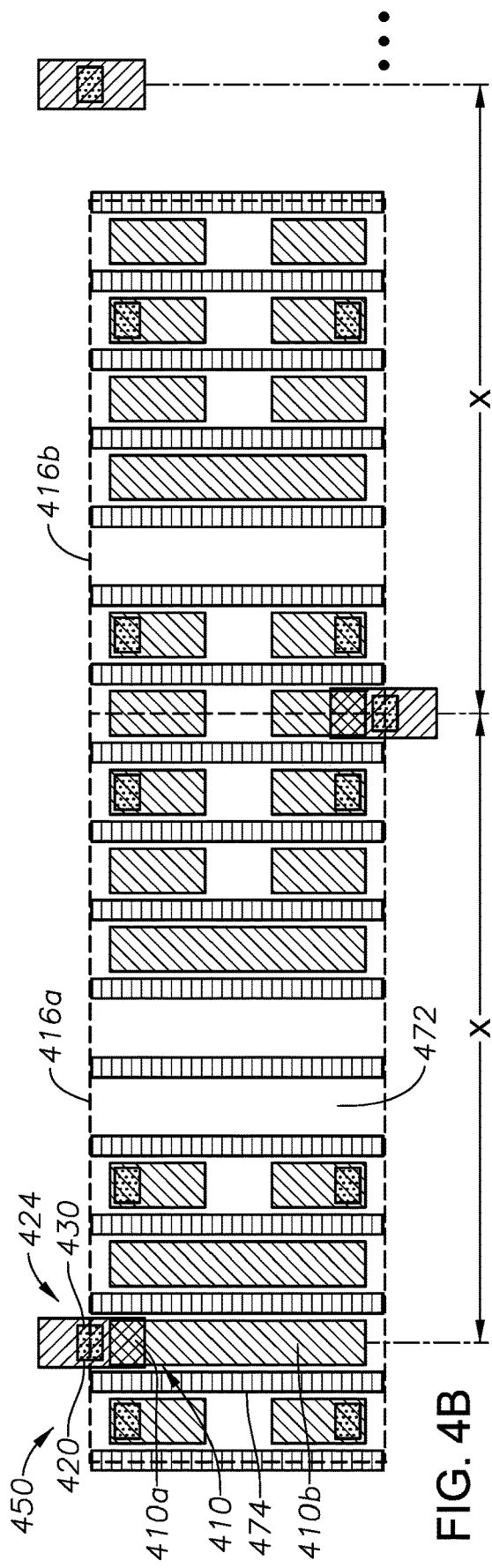
FIG. 4A
FIG. 4B

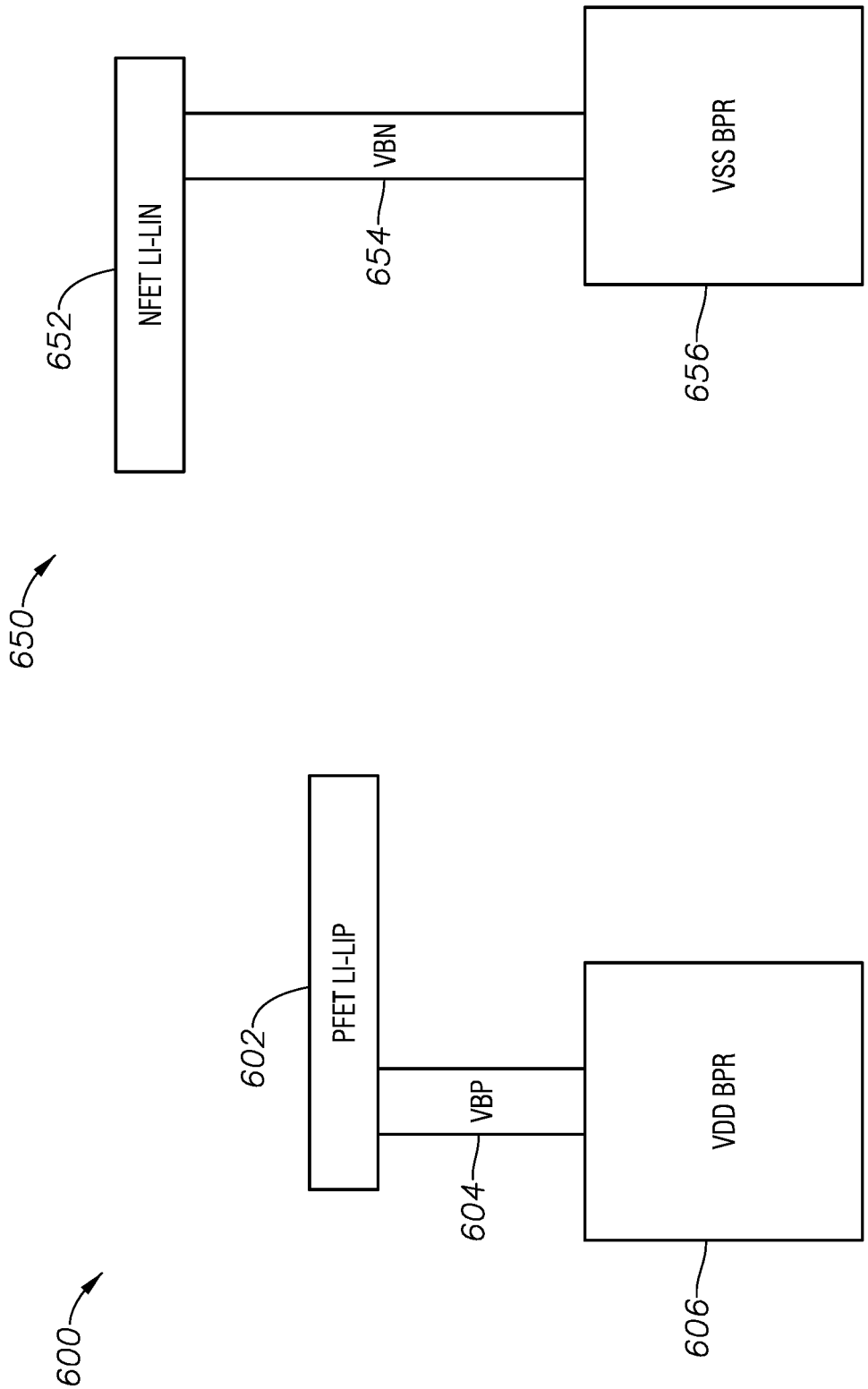

DEVICES AND METHODS OF LOCAL INTERCONNECT STITCHES AND POWER GRIDS

I. FIELD

The present disclosure is generally related to devices and methods of local interconnect stiches and power grids.

DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater area efficiency for memory storage capacity and read/write capabilities.

In power grid planning, standard cell architecture of computing devices may be designed with tap cells to allow for coupling between the standard cells and power rails. However, tap cells impose significant restrictions to the logic blocks of the cells. Such limitations include a greater consumption of area, which in turn would reduce the standard cell utilization rate in the particular logic block. Moreover, a maximum width of a standard cell would also be limited by the tap cell pitch. As an example, a tap cell pitch may be adjusted to comply with electro-migration and voltage drop requirements. For instance, a larger pitch would enable more cells to be placed between tap cells; thus, resulting in the negative effect of an increase in total current flowing within a buried power rail (BPR) between vertical power stripes. Hence, wider power rails and a greater number of vias would then have to be utilized to reduce the voltage drop in the power grid, which may also necessitate an increase in tap cell width. Consequently, both tap cell width and pitch would need to be accounted for together for compliance with electro-migration and voltage drop requirements. As such, there is a need in the art to improve physical layout design of power grids, especially in the context of the utilization of tap cells.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

FIGS. 4A-4B are schematic diagrams of example portions of a power grid in accordance with various implementations described herein.

FIGS. 6A-6B are schematic diagrams in accordance with various implementations described herein.in accordance with various implementations described herein.

Figure 7A:
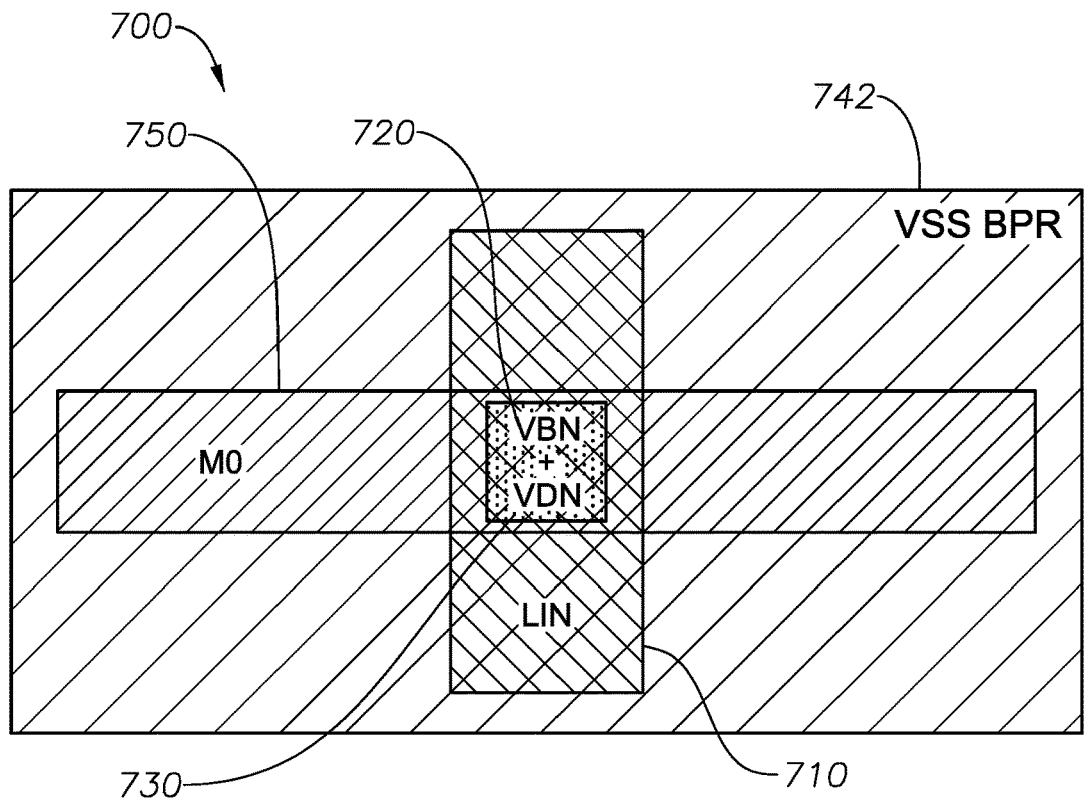

FIGS. 7A-7-B are schematic diagrams of example local interconnect stitches in accordance with various implementations described herein.

Figure 8:
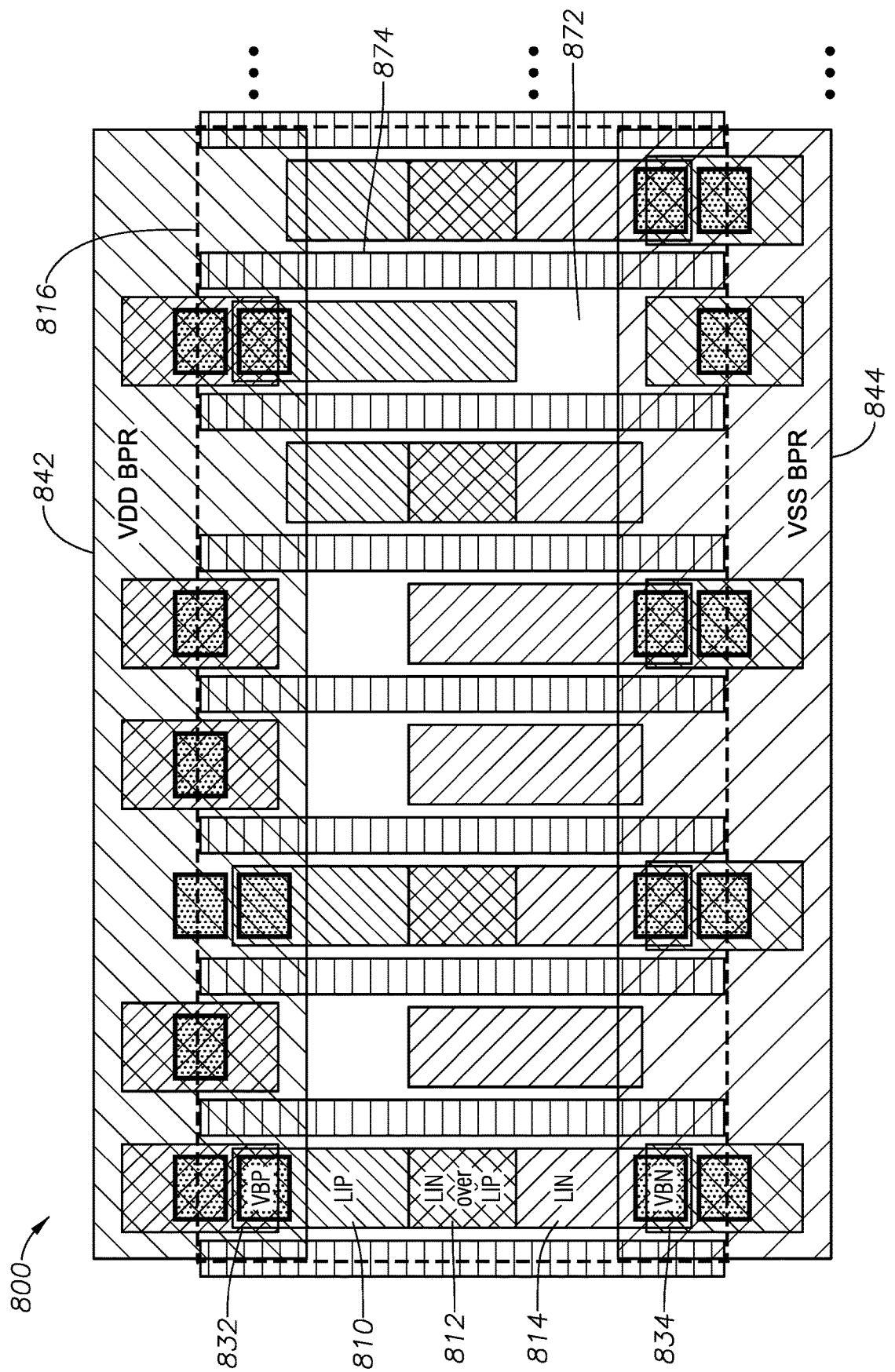

FIG. 8 is a schematic diagram of an example portion of a power grid in accordance with various implementations described herein.

Figure 9:
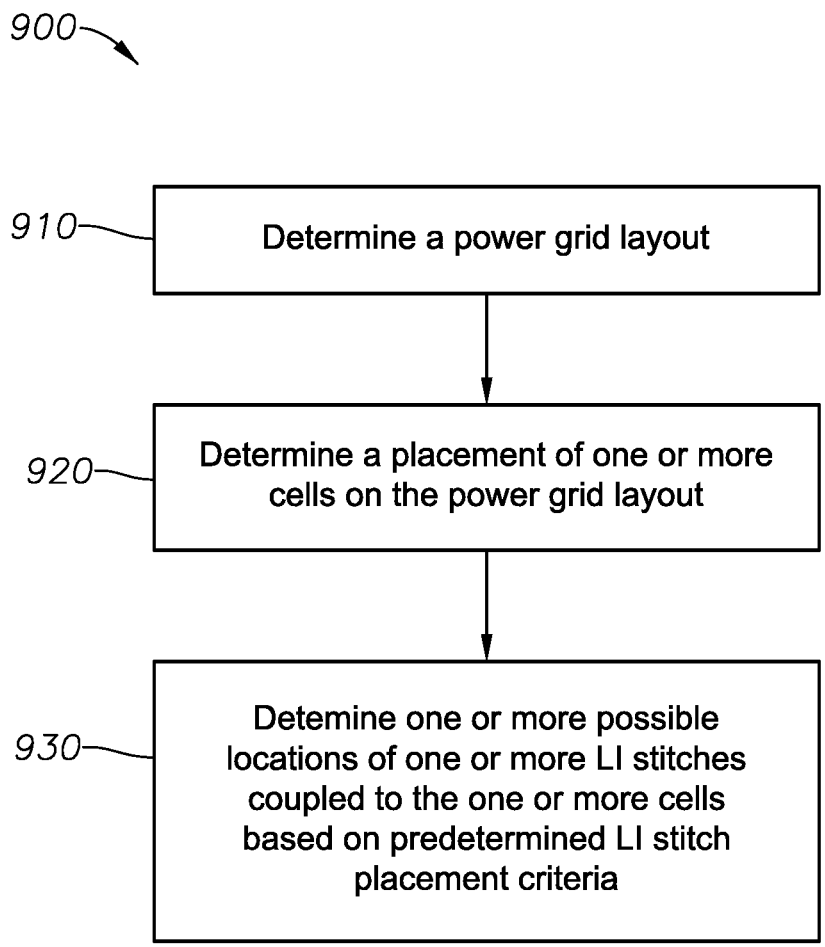

FIG. 9 is an operational method in accordance with various implementations described herein.

Figure 10:
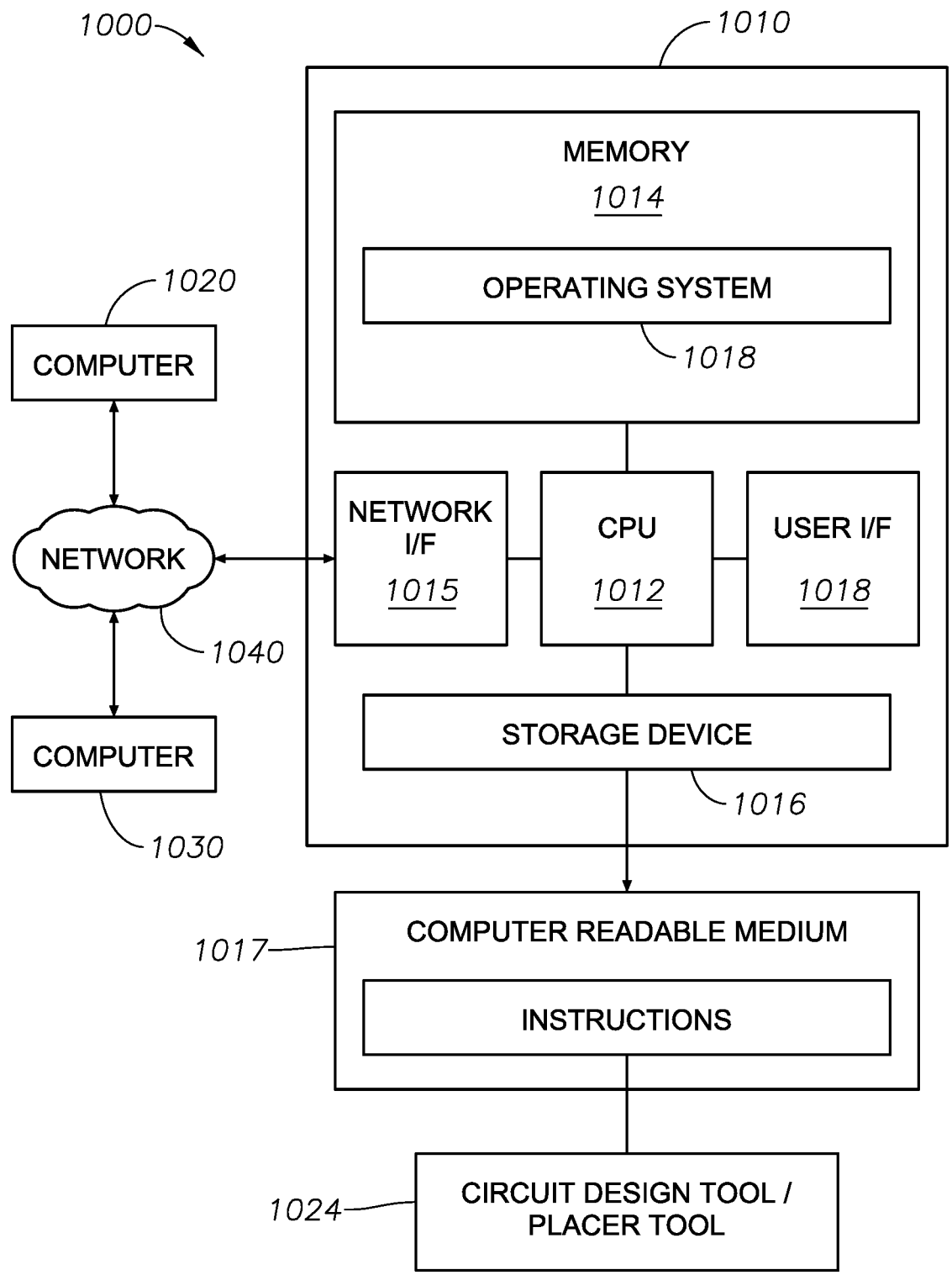

FIG. 10 is a block diagram in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. While certain diagrams as illustrated herein are shown in two-dimensions, aspects of the diagrams as provided herein are to be understood to be three-dimensional having X, Y and Z axes. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, a power grid includes: one or more cells; a metal layer; first and second buried power rails; and one or more local interconnects, wherein one or more local interconnect stitches are configured to electrically couple the one or more cells to either of the first or second buried power rails through the metal layer and the one or more local interconnects.

According to one implementation of the present disclosure, a method of local interconnect (LI) stitch placement includes: determining a power grid layout; determining a placement of one or more cells on the power grid layout; and determining one or more possible locations of one or more LI stitches of the one or more cells based on predetermined LI stitch placement criteria.

According to one implementation of the present disclosure, a local interconnect stitch includes a local interconnect, a metal layer, a first via coupling the local interconnect to a metal layer, and a second via coupling the local interconnect to a buried power rail.

Inventive aspects of the present invention relate to power grid and cell layout schemes and techniques that improve power grid (PG) layout in cell architectures. Advantageously, the various schemes and techniques described herein overcome limitations arising from the usage of tap cells in logic blocks. In certain implementations, the inventive aspects enable a buried power rail (BPR) to electrically couple to a first metal layer ($M_0$) connection of a power grid without the utilization of tap cells. In doing so, schemes and techniques disclosed herein provide for local interconnect (LI) stitches to replace the tap cells in power grid (PG) layouts in cell architectures.

Figure 1:
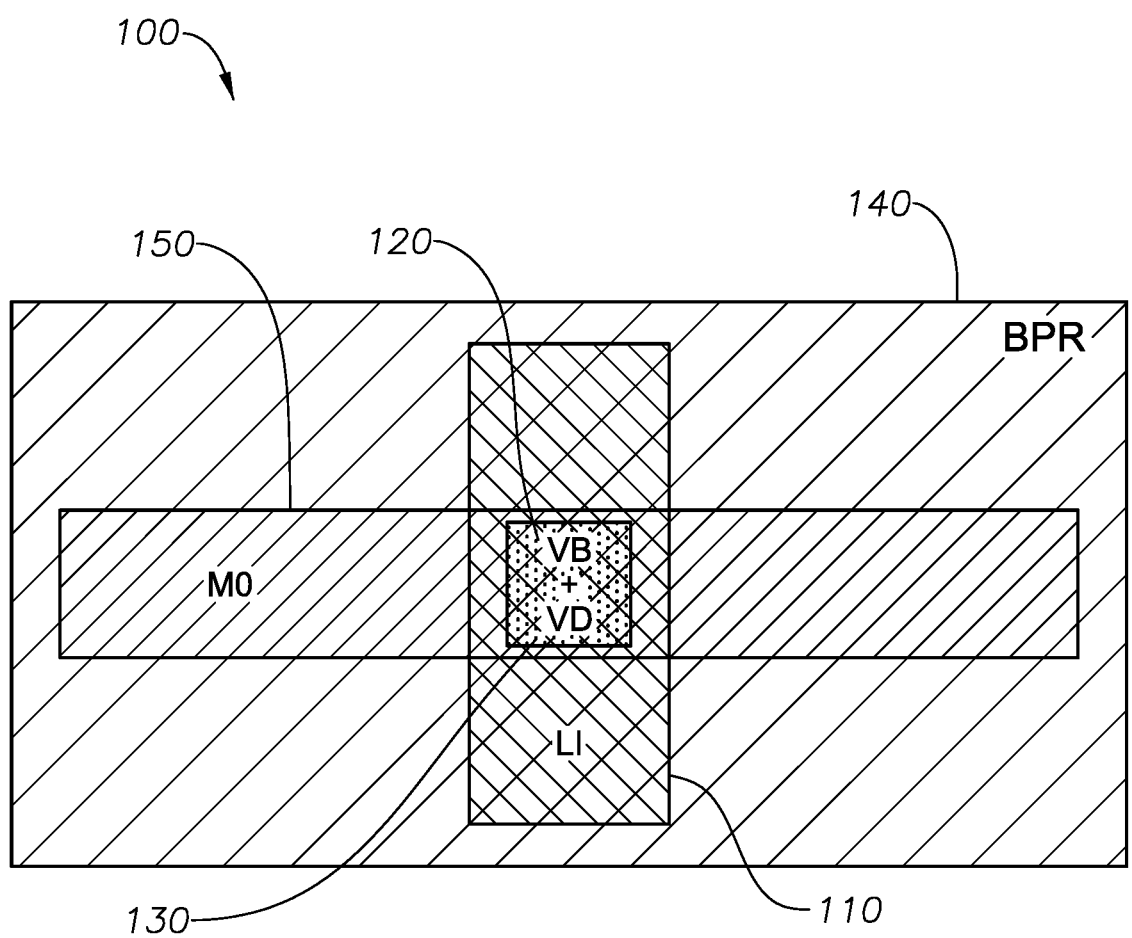
FIG. 1 is a schematic diagram of an example local interconnect stitch in accordance with various implementations described herein.

Referring to FIG. 1, an example top transparent view of an LI stitch 100 for a power grid is shown. As illustrated, the LI stitch 100 (i.e., a data stitch) may include the combination of a relatively "small" local interconnect metal "piece" that can enable the electrical coupling of a local interconnect (LI) 110, a first via 120 (VB), a second via 130 (VD), a portion of a buried power rail (BPR) 140 and a portion of a first metal layer 150 (e.g., $M_0$) (i.e., metal layer) (e.g., metal piece, power or signal routing metal/track, power or signal networks ("nets")) (or in an alternative implementation, a relatively "small" metal layer "piece" that is coupled to the first metal layer 150). In certain implementations, the local interconnect (LI) stitch 100 may be formed as the local interconnect (LI) 110 connecting (i.e., electrically coupling) to a buried power rail (BPR) 140 through the first via 120 (VB), and with the local interconnect (LI) 110 connecting (electrically coupling) to the first metal layer 150 ($M_0$) through a second via (VD) 130. Advantageously, the LI stitch 100 may be a connection (electrically coupling) between the BPR 140 and the first metal layer 150 ($M_0$), and would replace the area requirements and functionality of a tap cell.

In certain cases, the LI stitch 100 may be an LI piece to connect the BPR 140 underneath transistor devices of the power grid and the first metal layer of ($M_0$) above the transistor devices. It may be appreciated that the term "small" with respect to the LI stitch 100 corresponds to a maximum size that can allow electrical coupling between the BPR 140 and the first metal layer $M_0$ yet still enable a flexible placement of standard cells with respect to the power grid.

In example implementations (as described with reference to various embodiments described herein), the LI dimension for the stitch 100 may vary with a process node. For instance, in a 3 nm process node, the stitch 100 may be an approximate size of 20 nm width and 50 nm length. In certain cases, the LI size generated for the LI stitch would not be much different from the LI size used in cells. On one side, the physical layer LI may be used in cells to connect to the source-drain regions and to connect to a buried power rail (BPR) through a first via (VB) when the source-drain region would be connected to a power net (a metal layer $M_0$). On the other side, the LI physical layer may be used in the LI stitch 100 to connect to the buried power rail (BPR) through the first VB and to connect to the first metal layer through a second via (VD). In certain cases, the LI stitch may only be a part of the power grids and would not be a part of the cells. Hence, it is configured to enable the connection between the buried power rail (BPR) and the first metal layer ($M_0$) of the power grid. Hence, the LI stitch would be a "full structure" including the LI, the first via (VB) connecting to the BPR, and the second via (VD) connecting to the first metal layer ($M_0$).

Figure 2:
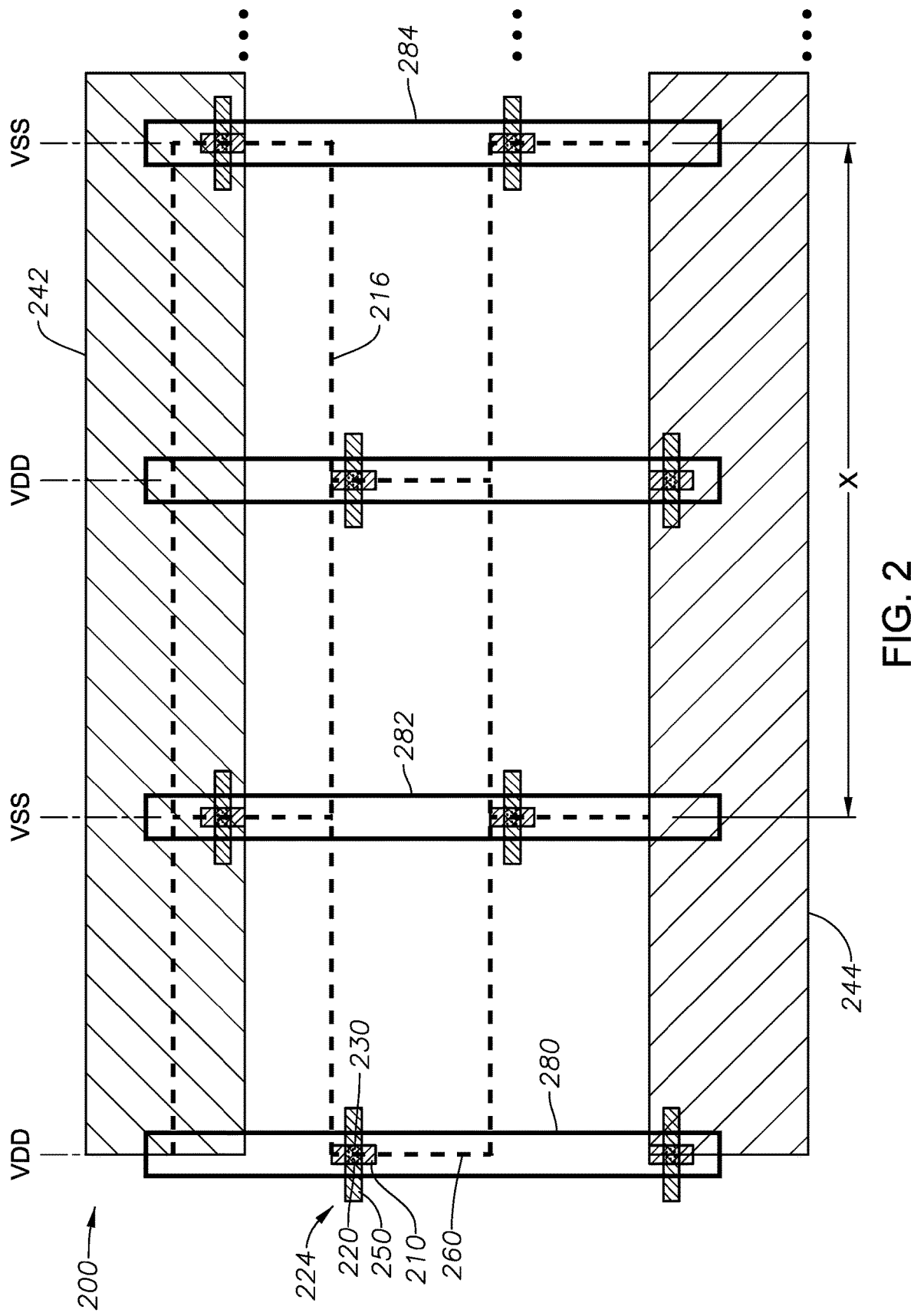
FIG. 2 is a schematic diagram of an example portion of a power grid in accordance with various implementations described herein.

In certain implementations, the BPR 140 (e.g., either a buried voltage supply power rail (VDD BPR) or a buried ground rail (VSS BPR) may be positioned below (i.e., lower in the Z-directional axis) standard cells (i.e., cell devices) (as shown in FIG. 2) and can be wider than various front-side power rails. Accordingly, such BPRs 140 would improve electromigration and voltage drop compliance. Moreover, by "freeing" up additional available signal routing tracks (as such BPRs are placed beneath the power grid architecture), BPRs 140 can contribute to the reduction of logic area by lessening routing congestion, resulting in power reduction and better performance.

The local interconnect (i.e., local interconnect layer) 110 may be a metal (e.g., "short range metal") that is localized to the standard cells (e.g., 216 in FIG. 2). The local interconnect layer 110 can be used to connect the terminals (e.g., drain, source, gate) of transistors in cell devices to the first metal layer 150 and power rails. In certain instances, the first metal layer (M0) may be utilized to connect input and output pins in cells (e.g., cells 216 as shown in FIG. 2) to connect to signal power or signal networks (i.e., signal or power nets). In various implementations as described herein, the LI is a physical layer of the power grid architecture. It can be used for both the LI stitch and LI connecting to the source/drain regions in the cell architecture (i.e., cell). Consequently, however, the LI portion of the stitch and LI in the cell architecture can be electrically coupled when the LI in the cell may be connected to a power net, either VSS or VDD, resulting in a redundant VB array (as described in below paragraphs).

The local interconnect 110 may be configured to contact the source and drains of the cell devices (e.g., cells 216 as shown in FIG. 2) and can be coupled below to the underlying BPR 140 through the first via 120 (VB) (e.g., a "short" between the LI 110 and the BPR 140), and further can be coupled above to the first metal layer (e.g., $M_0$) 150 through the second via 130 (VD). In one particular implementation, the second first via 130 (VD) may be stacked vertically (e.g., in the Z-axis) over the first via 120 (VB) (with the LI 100 in between). In other alternative implementations (not shown), the first and second vias 120, 130, may be coupled at different positions of the local interconnect 110. Such alternative implementations may include instances where the LI stitch may be shifted from the first via 120 (VB) based on locations of the $M_0$ routing tracks with respect to the cell border.

In an alternative implementation (not shown), the LI stitch 100 may include the coupling of a local interconnect (LI) 110, a first via 120 (VB), a second via 130 (VD), a portion of a power stripe (e.g., as shown in as power stripe 280 in FIG. 2) and a portion of a first metal layer 150 (e.g., $M_0$) (e.g., signal routing metal, track, power "net" (power network). In certain implementations, such a local interconnect (LI) stitch may be formed as the local interconnect (LI) 110 connecting (i.e., coupling) to the power stripe 280 through the first via 120 (VB), and with the local interconnect (LI) 110 connecting (coupling) to the first metal layer 150 ($M_0$) through a second via (VD) 130. It is further appreciated that in certain implementations utilizing a power stripe, the coupling of the first layer $M_0$ to the power stripe would include additional vias. For instance, if the vertical power stripe is $M_1$, an additional via ($V_0$) can couple $M_0$ to $M_1$. Advantageously, such an LI stitch 100 may be a connection (coupling) to further connect to a BPR 140 such that the BPR140 and may connect to the first metal layer 150 ($M_0$).

In one example implementation, the LI stitch 100 may be formed as the combination an LI metal piece that couples: a first via (VB) connecting to a BPR, a second via (VD) connecting to the first metal layer and a relatively "small" metal ($M_0$) piece. In certain cases, the small $M_0$ piece may be connected to a vertical power stripe at block level: connecting the BPR and the first meal layer. Similar to the LI stitch, the term "small" with respect to the small $M_0$ piece corresponds to a maximum size that can allow electrical coupling between the BPR 140 and the first metal layer $M_0$, and yet enable a flexible placement of standard cells with respect to the power grid.

In another alternative case, the LI stitch 100 may include just one of either the coupling of the local interconnect (LI) 110 to the first via 120 (VB) or the coupling of the second via 130 (VD) to a portion of a power stripe (e.g., as shown in as power stripe 280 in FIG. 2) or BPR 140 and the portion of a first metal layer 150 (e.g., M0) (e.g., signal routing metal, track, power "net" (power network).

Referring to FIG. 2, a diagram of a portion of a power grid circuitry 200 in accordance with various implementations described is shown. In various instances, the power grid circuitry 200 (e.g., multiple cell layouts, logic blocks) may refer to a device having a power grid architecture including, but not limited to: first and second buried power rails (i.e., power grid lines, BPR) (e.g., VDD BPR 242, VSS BPR 244); power stripes 280, 282 (e.g., vertical VDD and VSS power stripes); standard cells 216 (e.g., including one or more cell devices); one more metal layers 220 (e.g., $M_0$, metal piece, first metal signal routing track, first metal layers); one or more LI stitches 224 and first and second vias (VB, VD) 220, 230 fabricated with various physical cell layout schemes and techniques as described herein. Also, the power grid architecture may be fabricated with the LI stich placement schemes and techniques described herein for a physical cell and/or power grid circuitry.

As illustrated, each of the LI stiches 224 may be substantially similar to implementations of the examples of the LI stitch 100 as described above. In one example, the LI stitch 224 may include the coupling of a local interconnect (LI) 210, a first via 220 (VB), a second via 230 (VD) to a portion of a vertical power stripe (e.g., VDD power stripe 280, VSS power stripe 282) and a portion of a first metal layer 250 (e.g., MO) (e.g., power or signal routing metal/track, power or signal networks ("nets")). In certain implementations, the local interconnect (LI) stitch 224 may be formed as the local interconnect (LI) 210 connecting (i.e., coupling) to the vertical power stripe (e.g., 280, 282) through the first via 120 (VB), and with the local interconnect (LI) connecting (coupling) to the first metal layer 250 (Mo) through a second via (VD) 230. Advantageously, the LI stitch 224 may be a connection (coupling) between the BPR and the first metal layer 150 (MO), and may replace the area requirements and functionality of a tap cell. As shown, in various implementations, each of the LI stitches 224 may be placed at abutting borders of the cells 216. Thus, in contrast to tap cells, the LI stiches 224 can provide for area efficiency and flexibility optimization for the placement of the cells 216.

In certain implementations, the LI stitch 224 may be located at an abutting border 260 of the cells. Moreover, in various implementations, the LI stitch 224 may be stacked over a first via (VB) 220 or shifted from the first via (VB) 220 based on locations of the Mo routing track (which would offset the positioning of the second via (VB 230) with respect to the cell borders 260.

In certain instances, the power grid circuitry 200 can be configured to provide a power (VDD) or ground (VSS or GND) supply to the various cells 216 via respective buried power rails (BPRs) 242, 244. In certain implementations, the BPRs 242, 244 may be implemented extending a length of the power grid circuitry 200 (as shown) and positioned below (in the Z-direction) the standard cells 216 and the first metal layer ($M_0$).

The power grid layout 200 may further include metal layers, such as the first metal layer ($M_0$) 250 through an example Nth metal layer ($M_N$) (at each successive metal layers in the Z-direction). In certain implementations, the first metal layer ($M_0$) (i.e., metal layer) may be adjacent to or on a substantially similar "plane" (i.e., as in vertically on the Z-direction) as the source and drain regions and gates of the cells 216, and can be located at the cell boundaries (e.g., cell boundary 260) of each cell.

In some implementations, the grid layout 200 may further include power (VDD) and ground (VSS) power stripes 280, 282 (e.g., vertical power stripes) that extend in the Y-direction of the layout 200. The power stripes 280, 282 would allow for connectivity to the first metal layer ($M_0$) and the BPRs 242, 244. Accordingly, the BPRs 242, 244 may provide either power supply (VDD) or a ground (VSS) by way of the first metal layer ($M_0$) and the power stripes 280, 282.

Moreover, in certain implementations, the vertical power rail pitch ("X") may be a distance (i.e., a length) extending from a first ground power strip 282 to a second ground power strip 284. In some implementations, the vertical power rail pitch ("X") may be substantially the same as the pitch of the LI stitch 224.

Figure 3:
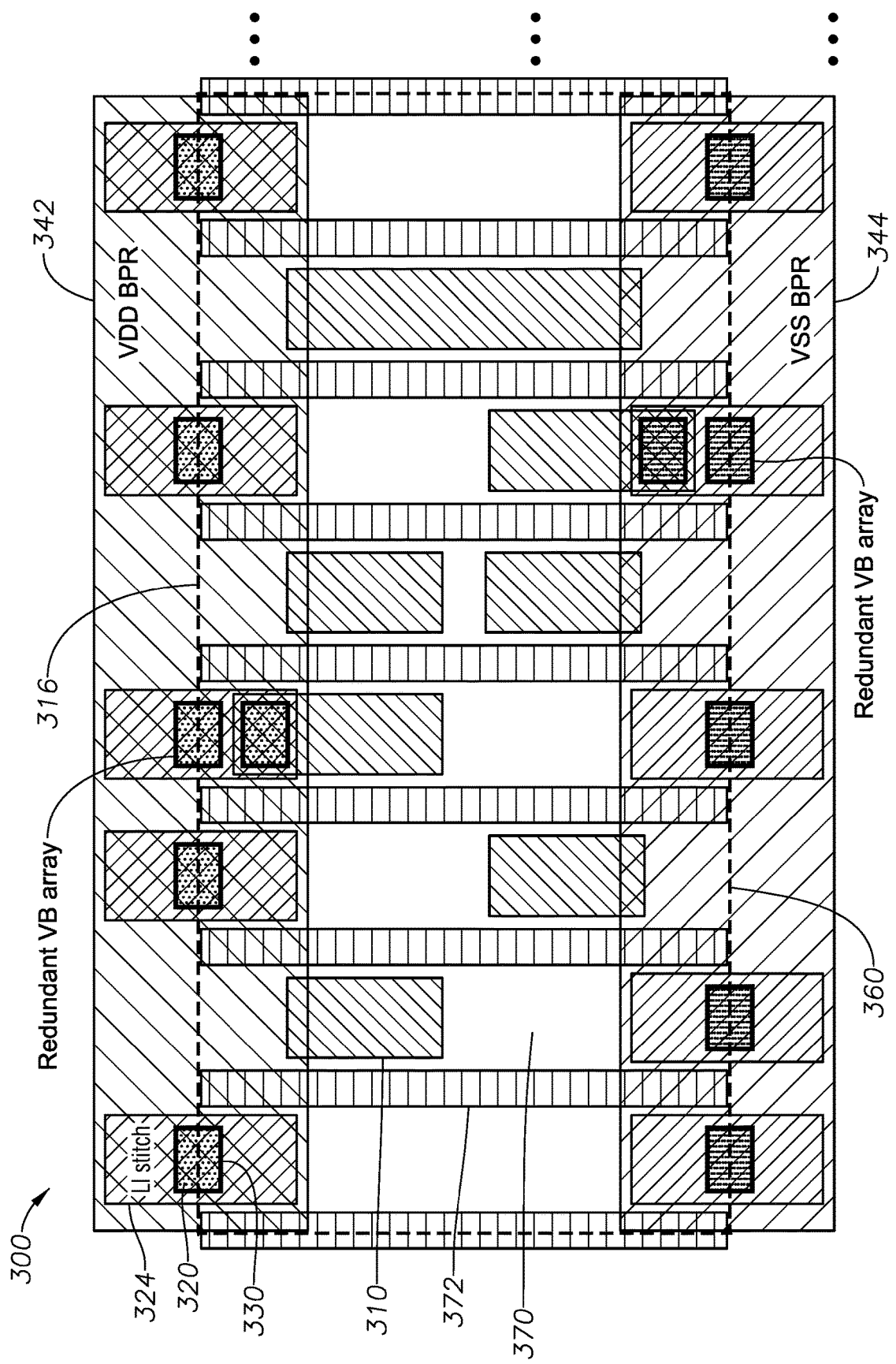
FIG. 3 is a schematic diagram of an example portion of a power grid in accordance with various implementations described herein.

Referring to FIG. 3, a top transparent view of a portion of a power grid architecture 300 for a particular standard cell 316 in accordance with various implementations described is shown. As illustrated, in certain cases, the standard cell of FIG. 3 may be substantially similar to a particular cell of the standard cells 216 in FIG. 2. In FIG. 3, the example standard cell 300 may refer to a device having a cell grid architecture including or coupled to: first and second buried power rails (i.e., power grid lines, BPR) (e.g., VDD BPR 342, VSS BPR 344); one or more local interconnects (LI) 310, multiple source and drain regions of the transistor devices 370 (not explicitly shown but would be present in the white space), multiple gates of the transistors 372, and one or more LI stitches 324 and multiple vias (VB, VD) 320, 330 (not explicitly shown) fabricated with various physical cell layout schemes and techniques as described herein. Also, the cell architecture may be fabricated with LI stich placement schemes and techniques described herein for a physical cell and/or power grid circuitry.

As depicted, FIG. 3 illustrates possible locations where the LI stitch 324 can be inserted in the cell. At block level, only one of these locations (one for VSS and one for VDD) would be used depending on the placement location of the cell. Alternatively, several locations may be used for wide cells when their width is greater than that of an LI stitch pitch (as described in later paragraphs). Accordingly, such locations may be spaced by a width of an LI pitch from each other. Moreover, in an example placement operation, for the physical implementation of the block, a power grid and the LI stitches are placed prior to the placement of the cells. Correspondingly, as the power grid has a fixed location, only the cells can be moved and placed at different locations.

In various cases, the local interconnect 310 would be coupled to the source lines of integrated circuits of the cell in source and drain regions 370 between the gates 372. In some instances, at the cell boundary 360, power stripes (e.g., vertical VDD and VSS power stripes) (not shown) can be included. Also, one more metal layers (not shown) (e.g., $M_0$, metal piece, first metal signal routing track, first metal layers) can be positioned on the power stripes or adjacent to the local interconnects 310 (in examples where the LI stitch is placed above a BPR).

Similar to the LI stiches 224 in FIG. 2, the LI stitches 324 of FIG. 3 may include (not shown) the coupling of a local interconnect 310 (LI), a first via 320 (VB), a second via 330 (VD), a portion of a vertical power stripe (e.g., VDD power supply stripe 380, VSS ground supply stripe-382) and a portion of a first metal layer 350 (e.g., MO) (e.g., power or signal routing metal/track, power or signal networks ("nets")). In certain implementations, the local interconnect (LI) stitch 324 may be formed as the local interconnect (LI) 310 connecting (i.e., coupling) to the vertical power stripe (e.g., 380, 382) through the first via 320 (VB), and with the local interconnect (LI) connecting (coupling) to the first metal layer 350 (MO) through a second via (VD) 330. Advantageously, the LI stitch 324 may be a connection (coupling) between the BPRs 342, 344 and the first metal layer 350 (MO) (not shown in FIG. 3), and may replace the area requirements and functionality of a tap cell.

In various implementations, the placement of standard cells 342 may be managed by a placer that operates to move cells 342 in a power grid layout in avoidance of design rule violations. Also, the placer can prevent the generation of "shorts" between the LI stiches 324 and the LIs 310 in the cells that are not coupled to power networks (power nets) (e.g., the metal layer $M_0$). Generally, design rules refer to a set of parameters provided by semiconductor manufacturers that enable a chip designer to verify accuracy of a mask set. Design rules are typically specific to a particular semiconductor manufacturing process, and a design rule set may specify particular geometric and connectivity restrictions so as to ensure sufficient margins that may account for variability in various semiconductor manufacturing processes to ensure that the circuitry works appropriately. Design rule checking (DRC) may be used to achieve a higher overall yield and reliability for a design. For instance, if design rules are violated, the design may not be functional. Also, to achieve a production goal of improving die yields, DRC typically involves design rules that modify and/or change existing features, insert new features and/or check an entire design for process limitations, such as, e.g., layer density. In some instances, a cell layout may include the geometric representation of the design and also data that provides support for manufacture of the cell layout design. While design rule checks may not validate that the design will operate correctly, the design rule checks may be constructed to verify that the structure meets the process constraints for a given design type and process technology.

Accordingly, possible locations of LI stitch 324 locations may be based on various predetermined rules. For example, certain rules may include, but are not limited to: 1) No LI 310 in the cell facing an LI stitch 324; 2) An LI 310 shall be provided in the cell connected to a power net and an LI stitch must "short" with an LI in the cell; and 3) An LI 310 must be provided in a cell that is far enough from LI stitch to maintain a minimum LI spacing. As would be appreciated, the term "short" as utilized throughout this disclosure is a "direct" connection. For instance, "shorted" nets are at an equivalent potential (i.e., voltage). If, for example, the LI in the cell connects to an LI stitch, the LI in the cell is connected to the corresponding power net In one example, an LI stitch location is determined to be invalid when an LI 310 in the cell is too close to an LI stitch 324 that is not connected to a power net, and thus, would violate minimum LI spacing requirements. To resolve the invalidity, a redundant VB via array (e.g., a duplicate VB via array (of via connections to a BPR), a plurality of vias arranged in a substantially similar pattern to increase the current carrying capacity of the vias) can be formed when the LI stitch 324 connects to the LI 310 in the cell that is connected to a power net. Accordingly, depending upon the via design rules, the via array may be kept as is, or may be merged into a single via. Correspondingly, the via array may represent each of the via (VB) 320 from an LI stitch 324 and vias (VB) 320 from the two abutting cells 316. Hence, in a case where there are two abutting cells, a maximum of a three VB array can be formed. For instance, when the LI stitch 324 connects to the LI 310 in the cell connected to a power net (either VSS or VDD), a VB array would automatically form and thus, make the first via (VB) 320 redundant, where one of the first vias (VB) occurring from the LI stitch and a second of the first vias (VB) from the LI in the cell are both connected to the power net.

In a second example, if a design rule states that the placement of the two vias 320 (VB) do not meet a minimum via spacing requirement, the two vias can be formed as a single merged via. Moreover, in a third example, if for instance, a LI 310 connected to a signal net (not connected to power net) may be deemed to be "too close" to a stitch 324 (and thus, a "short" is created at an internal net of the cell 316), the placer can move the positioning of the cell over so that no short would be created.

In certain implementations, utilizing an LI stitch 424 may impose that all standard cells 416 (e.g., 416a, 416b) can be placed having accounted for an LI stitch 424 pitch (e.g., "X"). Accordingly, cell placement would enable a possible insertion of "repeated" stitches. For instance, narrow cells 416 can be placed between LI stitches 424, and in addition, such narrow cells 416 would have valid LI stitch 424 locations; thus, enabling LI stitch 424 insertion within the cell 416.

Moreover, certain cells having a width larger than the LI stitch pitch ("X") must also ensure that repeated stitches can be inserted within a particular cell 416 without causing an LI spacing violation. In certain examples, the number of possible valid stitch locations would reflect the porosity of the cell to the power grid 400. A larger LI stitch pitch ("X") would increase the cell porosity to facilitate the cell placement, but would also increase the total current flowing through the stitches 424 resulting from a higher number of cells between the stitches. Accordingly, LI stitch insertion can be done either with VSS and VDD stitches facing each other or in a staggered mode. Advantageously, the staggered mode would yield a higher porosity.

Referring to FIGS. 4A and 4B, top transparent views of diagrams of example power grid circuitry 400, 450 in accordance with various implementations is shown. As illustrated, the power grid 400 circuitries 400, 450 represent two possible stitch 424 placements for a given cell 416 (e.g., 416a, 416b) for an 8 contacted poly pitch (CPP) LI stitch pitch (e.g., a length "X") in a staggered mode.

Each of the power grid layouts 400, 450 may be similar in components to that of FIGS. 2 and 3. In FIGS. 4A-4B, each the example layouts 400, 450 may refer to a power architecture including one or more cells 416 (e.g., 416a, 416b, etc.) and coupled to: buried power (i.e., power grid lines, BPR) (e.g., VDD BPR, VSS BPR) rails (not shown in FIGS. 4A-4B); one or more local interconnects 410, one or more source and drain regions of the transistor devices 472, multiple gates of the transistors 474, and multiple LI stitches 424 and multiple vias (VB, VD) 420, 430 (not explicitly shown) fabricated with various physical cell layout schemes and techniques as described herein. Also, the grid and cell architecture may be fabricated with LI stich 424 placement schemes and techniques described herein for a physical cell and/or power grid circuitry. In certain implementations, the one or more cells 416 may include a plurality of cells extending in the horizontal direction.

As shown, FIGS. 4A-4B illustrates two possible placements of a given cell for 8 CPP (contacted poly pitch) LI stitch pitch in staggered mode. In an example placement operation, a power grid layout would be set up prior to a placement of the cells 416a, 416b, etc. Accordingly, possible LI stitch 424 locations would be determined after locations of power grid elements including the BPRs and power and signal networks. In one example, as shown in FIGS. 4A-4B, two LI stiches 424 may be placed on an upper boundary of cells 416a, 416b for connection to the same power network (VDD), and one LI stich 424 may be placed on a lower boundary of cells 416a, 416b for connection to the ground network (VSS).

In FIG. 4A, the placement case is valid as LI stitches 424 "short" to LIs 410 connected to power nets (e.g., metal layers) in the cell. In FIG. 4B, the placement case is invalid as LI stitches 424 "short" LIs 410 in the cell 416 not connected to a power net (e.g., the LIs 410 that are coupled to LI stitches 424 do not have "stich" connections to a metal layer). For instance, in such cases, the cells 416 would need to be moved (e.g., shifted over by one or more contact poly pitches (i.e., one poly pitch corresponding to the pitch between two adjacent gates 474)) to find a valid placement location. As mentioned, the LI stitch is part of the power grid. The LI in the cell may be either connected to a power net (in this case VB connects to the power net) or a signal net.

As illustrated, the one or more LIs 410 may include a first LI portion in the cell (not connected to power net) 410a and a second LI portion 410b in the cell connected to power net. For instance, the second LI portion 410b can "short" with the LI stitch 424 while the first LI portion 410b cannot short with the LI stitch 424, and must respect a minimum spacing from 424. Moreover, such first and second LI portions 410a, 410b may be similarly included for respective example LIs 210, 310, 410, 510 and 810).

In certain implementations, the correct placement of the cell would be managed by the placer that can detect LI shorts or spacing violations. However, in case the placer does not perform the detection correctly, the cell layout may include a via (VD) (i.e., a via connection to a metal layer (e.g., $M_0$ metal layer) "obstruction" to indicate invalid stitch locations (as illustrated with reference to FIG. 5). Such via obstructions, as part of the abstract view used by the placer, may be configured to "guide" the placer to indicate that a via (VD) connection to the power grid at the first metal layer $M_0$ in an LI stitch cannot stand at the obstruction location. Hence, the placer would be forced to move the cell to another location.

Figure 5:
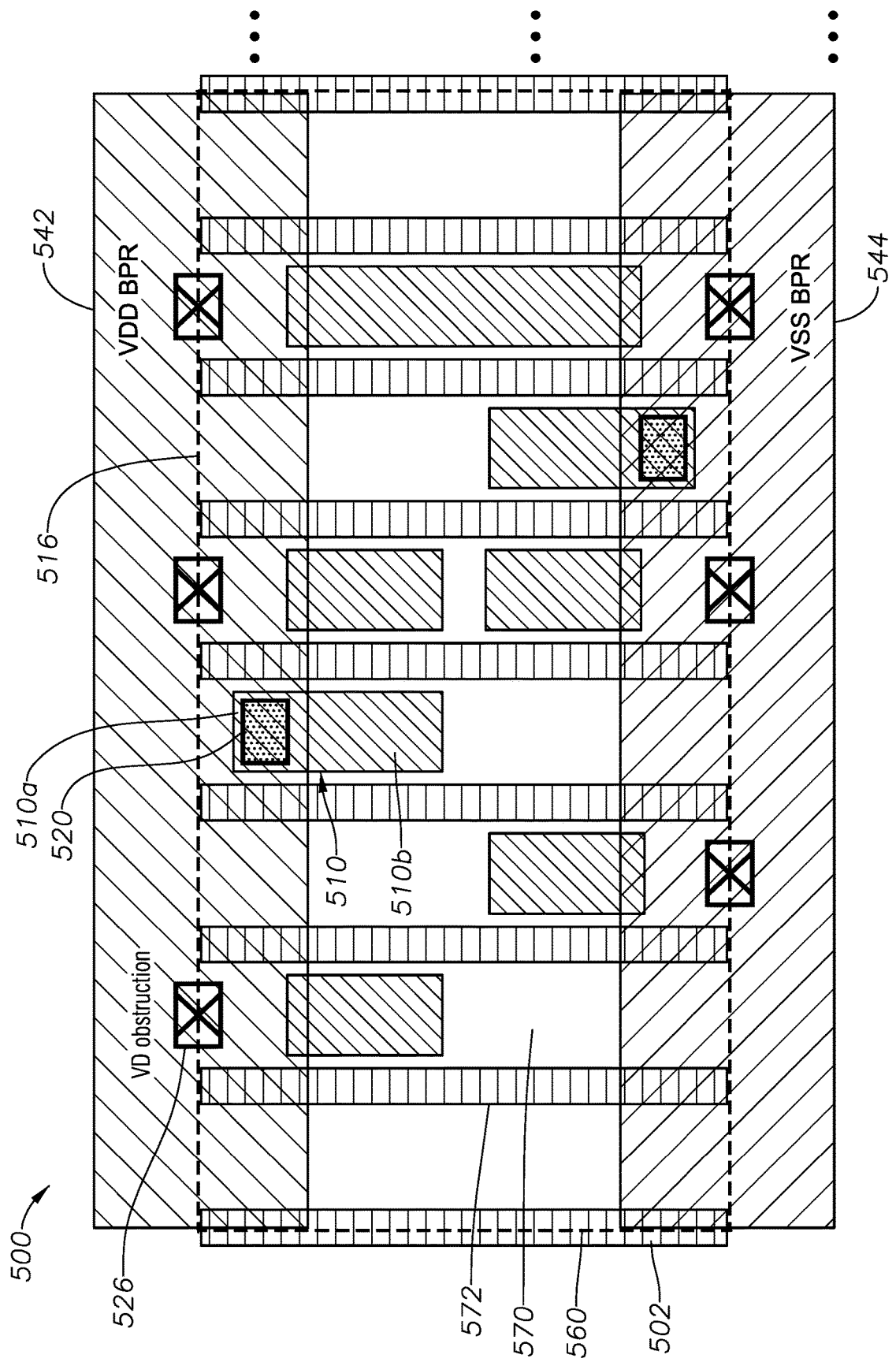
FIG. 5 is a schematic diagram of an example portion of a power grid in accordance with various implementations described herein.

Referring to FIG. 5, a top transparent view of a portion of a power grid architecture 500 for a particular standard cell 516 in accordance with various implementations described is shown. In certain implementations, such a cell 516 would include VD obstructions 526 indicating invalid LI stitch locations.

As illustrated, in certain cases, the standard cell of FIG. 5 may be substantially similar to a particular cell of the standard cells 216 in FIG. 2. In FIG. 5, the example standard cell may refer to a device having a cell grid architecture including or coupled to: buried power rails (i.e., power grid lines, BPR) (e.g., VDD BPR 542, VSS BPR 544); one or more local interconnects 510, multiple source and drain regions of the transistor devices 570, multiple gates of the transistors 572, where one or more of the LIs 510 may be connected to power nets and one or more vias (VB) 520 (i.e., LI 510b) fabricated with various physical cell layout schemes and techniques as described herein. Also, the cell architecture may be fabricated with LI stich placement schemes and techniques described herein for a physical cell and/or power grid circuitry.

Similar to earlier described cases, the local interconnect 510 would be coupled to the source lines (in source and drain regions 570 between the gates 572). In some instances, at the cell boundary 560, power stripes (e.g., vertical VDD and VSS power stripes) (not shown) can be included. Also, one more metal layers (not shown) (e.g., $M_0$, metal piece, first metal signal routing track, first metal layers) can be positioned on the power stripes or adjacent to the local interconnects 510 (in examples where the LI stitch is placed above a BPR 542, 544).

In an example operation, the power grid 500 may already be formed at this stage of circuit design. Accordingly, the next steps would be to: determine all of the connections between the cells, provide placement of the cells and provide checks to determine if the connection to the power and signal nets of the cell is possible for the particular technology. For instance, when a placer operates correctly, placement would occur in a valid placement location with no "short" being generated. However, current placement tools do not always identify if there is a short. To provide one solution, aspects of the present schemes and techniques identify all of the locations in the cell where a LI stitch cannot be inserted and that a placing tool (i.e., PNR tool, placer, obstruction placer) would need to know to move the cell. Advantageously, the technique would allow the placing tool to determine that a via (VD from LI stitch connecting to $M_0$) (i.e., a via connection to a metal layer in the cell) and a VD obstruction 526 cannot both be placed at the same location. Hence, the placing tool would prevent placement of the via (VD) at such a location.

In other implementations, advanced CMOS process nodes are soon to be expected to be three-dimensional vertically stacking devices including: complimentary FET (field-effect transistors) (CFET) stacks, an NFET (n-channel field-effect transistor) over a PFET (p-channel field-effect transistor), or a PFET over an NFET.

Referring to FIGS. 6A-6B, cross-sectional views 600, 650 of first and second local interconnect (LI)/buried power rail (BPR) couplings (i.e., a NFET coupling and a PFET coupling) in accordance with various implementations described are shown. In contrast to current NFET and PFET devices (that are located "beside" on another on substantially the same in source and drain regions of a cell), vertically stacked NFET and PFET devices extend "upward" (in the Z-direction) with different device heights. For instance, the NFET devices is positioned at a higher height than that of PFET devices.

Accordingly, in such instances, two different (LI) layers 602, 652 may be used. For example, a LIN (i.e., local interconnect for NFET coupling) 652 would connect to an NFET device source-drain (not shown) and an LIP (i.e., local interconnect for PFET coupling) 602 would connect to a PFET device source-drain (not shown). In certain cases, the LIN 652 may be connected to a VSS BPR (i.e., ground supply buried power rail) 656 through a first via (i.e., VBN, via for NFET coupling) 654, and the LIP 602 may be connected to VDD BPR (i.e., a power supply buried power rail) 606 through a second via (VBP, via for PFET coupling) 604.

Figure 7B:
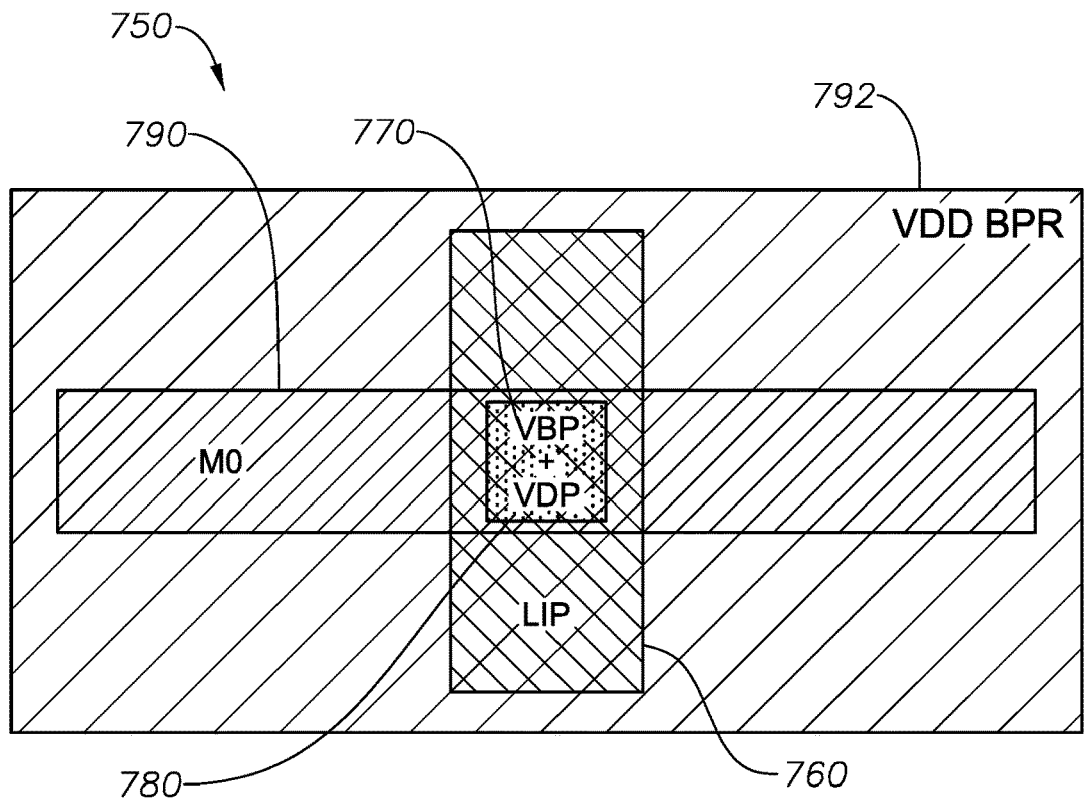

Referring to FIGS. 7A-7B, example top transparent views of LI stitches 700, 750 for a power grid are shown. As depicted, the first LI stitch 700 is for a coupling of a VSS BPR to VSS power grid, while the second LI stich 750 is for a coupling of a VDD BPR to the VDD power grid. The two LI stiches 700, 750 would include their own respective local interconnects and via connections.

As illustrated, similar to FIG. 1, the LI stitch 700 (i.e., an LI data stitch) may include the coupling of a local interconnect (LIN) 710, a first via 720 (VBN), a second via 730 (VDN) to a portion of a ground supply buried power rail (VSS BPR) 742 and at least a portion of a first metal layer 750 (e.g., M$_0$) (e.g., metal piece, power or signal routing metal/track, power or signal networks ("nets")). In certain implementations, the local interconnect (LI) stitch 700 may be formed as the local interconnect (LIN) 710 connecting (i.e., electrically coupling) to a ground supply buried power rail (VSS BPR) 742 through the first via 720 (VBN), and with the local interconnect (LIN) 710 connecting (i.e., electrically coupling) to the first metal layer 750 (e.g., M$_0$) through a second via (VDN) 730. Advantageously, the LI stitch 700 may be a connection (electrical coupling) between the VSS BPR 740 and the first metal layer 750 (M$_0$), and can replace the area requirements and functionality of a tap cell.

As illustrated, similar to FIG. 1, the LI stitch 750 (i.e., an LI data stitch) may include the coupling of a local interconnect (LIP) 760, a first via 770 (VBP), a second via 780 (VDP) to a portion of a power supply buried power rail (VDD BPR) 792 and at least a portion of a first metal layer 790 (e.g., M$_0$) (e.g., metal piece, power or signal routing metal/track, power or signal networks ("nets")). In certain implementations, the local interconnect (LIP) stitch 750 may be formed as the local interconnect (LIP) 770 connecting (i.e., electrically coupling) to a power supply buried power rail (VDD BPR) 742 through the first via 770 (VBP), and with the local interconnect (LIP) 710 connecting (i.e., electrically coupling) to the first metal layer 790 (e.g., M$_0$) through a second via (VDP) 780. Advantageously, the LI stitch 750 may be a connection (electrical coupling) between the VDD BPR 792 and the first metal layer 790 (M$_0$), and can replace the area requirements and functionality of a tap cell.

Advantageously, the LI stitches 700, 750 allow for greater flexibility and prioritization in placements of local interconnects (e.g., providing a greater number of LIP near the bottom portions of a power layout (in Z-direction) and providing a greater number of LIN near the bottom portions of the power grid layout (in Z-direction)). Moreover, due to the placement of LIN and LIP stitches, as an advantage, the generation of a "short" of an LI in a cell and an LI in a stitch may be prevented.

Referring to FIG. 8, a top transparent view of a portion of a power grid architecture 800 for a particular standard cell 816 in accordance with various implementations described is shown. In certain implementations, such a cell 816 would include the LI stitches 700 (for NFET coupling), 750 (for PFET coupling). For instance, the LIN stitch 700 may be equivalent to a first LIN stitch 834 in FIG. 8 and the LIP stitch 750 may be equivalent to a second LIP stitch 832 in FIG. 8.

In an example implementation, in certain cases, the standard cell of FIG. 8 may be substantially similar to a particular cell of the standard cells 216 in FIG. 2. In FIG. 8, the example standard cell 816 may refer to a device having a cell grid architecture including or coupled to: buried power rails (i.e., power grid lines, BPR) (e.g., VDD BPR 842, VSS BPR 844); first and second local interconnects (e.g., one or more LIPs 810 and one or more LINs 814), multiple source and drain regions of the transistor devices 872, multiple gates of the transistors 874, and multiple LI stitches (e.g., first and second LI stitches 832 (LIP stich), 834 (LIN stitch)) and multiple vias (VB, VD) 520, 530 (not explicitly shown) fabricated with various physical cell layout schemes and techniques as described herein. Also, the cell architecture may be fabricated with LI stich placement schemes and techniques described herein for a physical cell and/or power grid circuitry.

In FIG. 8, the standard cell 816 may further include regions 812 where the first and second local interconnects 810, 812 overlap. In certain examples, as NFET devices in the cell are positioned above PMOS devices in the cell, the corresponding local interconnect 810 and 812 would have the same corresponding relationship. Accordingly, the local interconnects (LIP) 810 would be at a lower cell height than that of the local interconnects (LIN) 814. Hence, the first local interconnects (LIP) 810 may be positioned at the bottom portions of the cell, while the second local interconnects (LIN) 812 may be positioned at the top portions of the cells.

Advantageously, the LI stitches 832, 834 allow for greater flexibility and prioritization in placements of local interconnects (e.g., providing a greater number of LIP near the bottom portions of a power layout (in Z-direction) and providing a greater number of LIN near the bottom portions of the power grid layout (in Z-direction)). Moreover, due to the placement of LIN and LIP stitches, as an advantage, as there is now sufficient spacing, the generation of a "short" of an LI in a cell and an LI in a stitch may be prevented. Furthermore, as an additional advantage, the extra spacing allows for greater ease in the insertion of stitches.

Referring to FIG. 9, a flowchart of an example method 900 (i.e., procedure) for local interconnect (LI) stitch placement is shown. Advantageously, in various implementations, the method 900 depicts the placement steps implemented by a placement tool (e.g., the tool 1024 as described with reference to FIG. 10). The method 900 may be implemented with reference to circuit implementations and placement criteria as described with reference to FIGS. 1-8.

At block 910, a power grid layout may be determined. For example, the power grid layouts 200, 300, 400, 500 and 800 may be determined based on predetermined circuit designer criteria. In certain implementations, the power grid layout includes the buried power rail layout and all the metal layers of a metal stack used in the process. The buried power rail and the metal rails can be as "wide" as possible in accordance with the design rules to minimize their electrical resistance; thus, reducing voltage drop and maximizing the electromigration threshold.

At block 920, a placement of one or more cells on the power grid layout may be determined. For example, the cell architectures 216, 316, 416 (416a, 416b), 516 and 816 placement may be determined based on various predetermined circuit designer criteria as wells as rules described with references to, for example, FIGS. 3, 4, and 5. In certain implementations. the cells may be placed by a placer to minimize the interconnection length between the cells; thus, reducing the parasitic resistance and capacitance of the interconnection wires. Correspondingly, the goal would be to reduce power consumption and timing delay between the cells.

At block 930, one or more possible locations of one or more LI stitches coupled to the one more or cells are determined based on predetermined LI stitch placement criteria. For example, one or more possible locations of one or more LI stitches (e.g., 100, 224, 324, 424, 700, 750, 832, 834) can be determined based on predetermined LI stitch placement criteria as described with reference to for example, FIGS. 3, 4, and 5. In certain implementations, as described herein, the cells may be placed by a placer to abide by the LI stitch rules: for example, a predetermined distance (pitch) between the stitches, no short to a non-power net, and no violation of the LI design rules.

FIG. 10 illustrates example hardware components in the computer system 1000 that may be utilized by a placer and to generate an integrated circuit design/memory architecture output. In certain implementations, the example computer system 1000 (e.g., networked computer system and/or server) may include circuit design and placer tools 1024) and execute software based on the procedure as described with reference to the method 900 in FIG. 9. In certain implementations, the circuit design and placer tools 1024 may be included as a feature of an existing memory compiler software program allowing users to input power grid and cell layout criteria, and generate power grids and cell layouts accordingly.

The circuit design and placer tools 1024 may provide generated computer-aided physical layout designs for memory architecture. The procedure 900 may be stored as program code as instructions 1017 in the computer readable medium of the storage device 1016 (or alternatively, in memory 1014) that may be executed by the computer 1010, or networked computers 1020, 1030, other networked electronic devices (not shown) or a combination thereof. In certain implementations, each of the computers 1010, 1020, 1030 may be any type of computer, computer system, or other programmable electronic device. Further, each of the computers 1010, 1020, 1030 may be implemented using one or more networked computers, e.g., in a cluster or other distributed computing system.

In certain implementations, the system 100 may be used with semiconductor integrated circuit (IC) designs that contain all standard cells, all blocks or a mixture of standard cells and blocks. In a particular example implementation, the system 1000 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 1000 may be stored in one or more of memory 1014 or storage devices 1016 of computer 1010 or in networked computers 1020, 1020.

The system 1000 may perform the following functions automatically, with variable user input: logical synthesis; timing and power optimization; clock tree generation; identification of logic designs, identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 1000 to produce the target results that are required by a designer. In certain implementations, the system 1000 may also provide for the capability to manually perform functions such as: cell region creation, block placement, pad and cell placement (before and after automatic placement), net routing before and after automatic routing and layout editing. Moreover, verification functions included in the system 1000 may be used to determine the integrity of a design after, for example, manual editing, design rule checking (DRC) and layout versus schematic comparison (LVS).

In one implementation, the computer 1000 includes a central processing unit (CPU) 1012 having at least one hardware-based processor coupled to a memory 1014. The memory 814 may represent random access memory (RAM) devices of main storage of the computer 1010, supplemental levels of memory (e.g., cache memories, non-volatile or backup memories (e.g., programmable or flash memories)), read-only memories, or combinations thereof. In addition to the memory 1014, the computer system 1000 may include other memory located elsewhere in the computer 1010, such as cache memory in the CPU 1012, as well as any storage capacity used as a virtual memory (e.g., as stored on a storage device 1016 or on another computer coupled to the computer 1010).

The computer 1010 may further be configured to communicate information externally. To interface with a user or operator (e.g., a circuit design engineer), the computer 1010 may include a user interface (I/F) 1018 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1010 may include a network interface (UF) 1015 which may be coupled to one or more networks 1040 (e.g., a wireless network) to enable communication of information with other computers and electronic devices. The computer 1060 may include analog and/or digital interfaces between the CPU 1012 and each of the components 1014, 1015, 1016, and 1018. Further, other non-limiting hardware environments may be used within the context of example implementations.

The computer 1010 may operate under the control of an operating system 1026 and may execute or otherwise rely upon various computer software applications, components, programs, objects, modules, data structures, etc. (such as the programs associated with the procedure 900 and related software). The operating system 1028 may be stored in the memory 1014. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 1026 in the example of FIG. 10 is shown in the memory 1014, but components of the aforementioned software may also, or in addition, be stored at non-volatile memory (e.g., on storage device 1016 (data storage) and/or the non-volatile memory (not shown). Moreover, various applications, components, programs, objects, modules, etc. may also execute on one or more processors in another computer coupled to the computer 1010 via the network 1040 (e.g., in a distributed or client-server computing environment) where the processing to implement the functions of a computer program may be allocated to multiple computers 1020, 1030 over the network 1040.

In example implementations, circuit macro diagrams have been provided in FIGS. 1-8, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-10 may illustrate systems, apparatuses, or methods according to the teachings of the disclosure, the disclosure is not limited to these illustrated systems, apparatuses, or methods. One or more functions or components of any of FIGS. 1-10 as illustrated or described herein may be combined with one or more other portions of another of FIGS. 1-10. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 614, the storage device 616, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A device comprising:
    one or more standard cells arranged within a cell boundary;
    one or more front-side metal layers including a first metal layer;
    first and second buried power rails placed beneath the one or more standard cells and the first metal layer; and
    one or more local interconnects, wherein one or more local interconnect stitches are disposed at the cell boundary, and wherein the one or more local interconnect stitches are configured to electrically couple the one or more standard cells to either of the first or second buried power rails through the first metal layer and the one or more local interconnects.

2. The device of claim 1, wherein each of the one or more local interconnect stitches comprise:
    at least a respective portion of the one of the one or more local interconnects, wherein each of the one or more local interconnects comprises a localized metal of a respective standard cell;
    a respective portion of the first metal layer, wherein a maximum size of the respective portion of the first metal layer corresponds to optimizing for configurability for both: (1) electrical coupling between the first metal layer and the first or the second buried power rails, and (2) placement of the one or more standard cells with respect to the device;
    a first via for coupling of the portion of the one of the local interconnects to the portion of the first metal layer; and
    a second via for coupling of the portion of the one of the local interconnects to either a power stripe or the first or the second buried power rails.

3. The device of claim 2,
    wherein each of the one or more local interconnects is configured to couple one or more of: drain, source, or gate terminals of transistor devices of the one or more standard cells to the first metal layer and the first and second power rails; and
    wherein the second via comprises multiple vias arranged as a redundant via array or a merged single via.

4. The device of claim 1,
    wherein each of the one or more local interconnects is configured to contact at least one of source and drain regions of one or more integrated circuits of the one or more standard cells; and
    wherein the one or more interconnect stitches are configured to transmit current from the buried power rail to one or more integrated circuits of the one or more standard cells.

5. The device of claim 1, further comprising:
    one or more respective power stripes,
    wherein the one or more power stripes are coupled from the one or more local interconnects to either a first or second buried power rail.

6. The device of claim 1, wherein:
    the first buried power rail comprises a ground supply power rail,
    the second buried power rail comprises a power supply power rail, and
    the first buried power rail and the second buried power rail are positioned below the one or more standard cells and the first metal layer.

7. The device of claim 1, wherein each of the one or more standard cells comprise:
    one or more source and drain regions of transistor devices, and one or more gates of the transistor devices,
wherein the transistor devices comprises n-channel field-effect transistor (NFET) or p-channel field-effect transistor (PFET) transistor devices.

8. The device of claim 1, wherein the one or more local interconnects comprise one or more first local interconnects positioned at a first cell height and one or more second local interconnects positioned at a second cell height.

9. The device of claim 8, wherein:
the first local interconnects are positioned at bottom portions of the standard cells, and
the second local interconnects are positioned at top portions of the standard cells.

10. The device of claim 8, wherein:
the first local interconnects are configured to couple NFET devices to the first buried power rail,
the second local interconnects are configured to couple PFET devices to the second buried power rail, and
the first buried power rail comprises a ground supply power rail and the second buried power rail comprises a power supply power rail.

11. The device of claim 1, wherein the device does not include a tap cell.

12. A local interconnect stitch comprising:
a local interconnect coupled to one or more standard cells;
a metal layer from one or more front-side metal layers in a power grid;
a first via coupling the local interconnect to the metal layer, and
a second via coupling the local interconnect to a buried power rail placed beneath the power grid, the one or more standard cells and the metal layer,
wherein the first via is coupled to the metal layer above the local interconnect, and
wherein the second via is coupled to the buried power rail below the local interconnect.

13. The local interconnect stitch of claim 12, wherein the first and second vias are coupled on different sides of the local interconnect.

14. The local interconnect stitch of claim 12, wherein the metal layer is coupled to one or more PFET (p-channel field-effect transistor) devices, and wherein the buried power rail is a power supply rail.

15. The local interconnect stitch of claim 12, wherein the metal layer is coupled to one or more NFET (n-channel field-effect transistor) devices, and wherein the buried power rail is a ground supply rail.

16. The local interconnect stitch of claim 12, wherein the local interconnect comprises a localized metal of the one or more standard cells.

17. The local interconnect stitch of claim 12, wherein a maximum size of the metal layer corresponds to optimizing for configurability for both: (1) electrical coupling between the metal layer and the buried power rail, and (2) placement of the one or more standard cells with respect to the power grid.

* * * * *